United States Patent
He

(10) Patent No.: US 10,802,369 B2
(45) Date of Patent: Oct. 13, 2020

(54) FAN-OUT WIRE ARRANGEMENT AND DISPLAY DEVICE

(71) Applicant: HKC CORPORATION LIMITED, Shenzhen, Guangdong (CN)

(72) Inventor: Huailiang He, Guangdong (CN)

(73) Assignee: HKC CORPORATION LIMITED, Shenzhen (CN)

( * ) Notice: Subject to any disclaimer, the term of this patent is extended or adjusted under 35 U.S.C. 154(b) by 12 days.

(21) Appl. No.: 16/313,482

(22) PCT Filed: Dec. 6, 2018

(86) PCT No.: PCT/CN2018/119565
§ 371 (c)(1),
(2) Date: Dec. 27, 2018

(87) PCT Pub. No.: WO2020/098021
PCT Pub. Date: May 22, 2020

(65) Prior Publication Data
US 2020/0150503 A1    May 14, 2020

(30) Foreign Application Priority Data
Nov. 14, 2018  (CN) .......................... 2018 1 1352962

(51) Int. Cl.
*H01L 27/118*     (2006.01)
*G02F 1/1362*     (2006.01)
*G02F 1/133*      (2006.01)
*H01L 27/32*      (2006.01)
*G02F 1/136*      (2006.01)

(52) U.S. Cl.
CPC .... *G02F 1/136286* (2013.01); *G02F 1/13306* (2013.01); *G02F 2001/13606* (2013.01); *H01L 27/3276* (2013.01)

(58) Field of Classification Search
CPC ...................... G02F 1/136286; G02F 1/13306
USPC ......................................... 257/210
See application file for complete search history.

(56) References Cited

U.S. PATENT DOCUMENTS

| | | | | |
|---|---|---|---|---|
| 7,023,515 B2* | 4/2006 | Kim | ............ | G02F 1/134363 349/139 |
| 7,436,478 B2* | 10/2008 | Park | ............ | G02F 1/133351 349/139 |
| 7,737,933 B2* | 6/2010 | Yamano | ............ | G09G 3/3625 345/94 |
| 8,493,345 B2* | 7/2013 | Anno | ............ | G06F 3/044 178/18.01 |
| 2019/0206894 A1* | 7/2019 | Lee | ............ | G02F 1/136286 |

* cited by examiner

Primary Examiner — Tan N Tran

(57) ABSTRACT

Embodiments of the present application provide a fan-out wire arrangement and a display device. The fan-out wire arrangement includes a plurality of first fan-out wires and a plurality of second fan-out wires, a dummy insulation wire is disposed at each first fan-out wire, a preset quantity of second fan-out wires are disposed between every two adjacent first fan-out wires, and the plurality of first fan-out wires and the plurality of second fan-out wires are distributed side by side, so that coupling capacitance generated between adjacent fan-out wires is reduced, thereby improving the stability of a display panel.

20 Claims, 2 Drawing Sheets

FAN-OUT WIRE ARRANGEMENT AND DISPLAY DEVICE

CROSS-REFERENCE TO RELATED APPLICATIONS

This application is the International Application No. PCT/CN2018/119565 for entry into US national phase with an international filing date of Dec. 6, 2018, designating US, now pending, and claims priority to Chinese Patent Application No. 201811352962.8, filed on Nov. 14, 2018, the content of which is incorporated herein by reference in its entirety.

BACKGROUND OF THE INVENTION

Field of the Invention

Embodiments of the present application relate to the technical field of displaying, and more particularly to a fan-out wire arrangement and a display device.

Description of Related Art

The description herein provides only background information relating to the present application, but does not necessarily constitute the exemplary technology. Fan-out wires are an important part in circuit board design and exist widely in wire design of various common circuit boards, for example, design of a thin-film-transistor liquid-crystal display (TFT-LCD) panel. Resistance differences between leads in fan-out wires cause signal delay, for example, cause a screen tearing phenomenon in a TFT-LCD panel. During manufacturing process of a display panel, on a same layer of metal, an outer-circle pattern and a central pattern have different environments, resulting in different etching rates to form resistance differences in the leads. To reduce differences between the leads, a dummy insulation wire is usually formed on a fan-out wire in a peripheral region, so as to keep a same etching rate for effective patterns in the panel.

However, in an existing fan-out wire arrangement, because fan-out wires have excessively small wire pitches, an etchant usually remains between fan-out wires to form coupling capacitance and cause lower stability of a display panel.

BRIEF SUMMARY OF THE INVENTION

It is an objective of the present application to provide a fan-out wire arrangement and a display device, for the purpose of, including but not limited to, reducing coupling capacitance formed between fan-out wires and improve the stability of a display panel.

Some embodiments of the present application provides a fan-out wire arrangement, the fan-out wire arrangement including:

a plurality of first fan-out wires, where a dummy insulation wire is disposed at each first fan-out wire; and a plurality of second fan-out wires, where at least one second fan-out wire is disposed between every two adjacent first fan-out wires, and the plurality of first fan-out wires and the plurality of second fan-out wires are distributed side by side.

In some embodiments, the dummy insulation wires on every two adjacent first fan-out wires have the same length.

In some embodiments, the dummy insulation wire is insulated from a data line in a display panel.

In some embodiments, the plurality of first fan-out wires has an equal length.

In some embodiments, the plurality of first fan-out wires and the plurality of second fan-out wires are respectively connected to corresponding data lines in a display panel.

In some embodiments, the same number of second fan-out wires are provided between every two adjacent first fan-out wires.

In some embodiments, one second fan-out wire is disposed between every two adjacent first fan-out wires.

In some embodiments, the dummy insulation wire on each first fan-out wire includes a plurality of sub-dummy insulation wires, and the plurality of sub-dummy insulation wires is not in contact with each other.

In some embodiments, the plurality of first fan-out wires and the plurality of second fan-out wires are respectively connected to corresponding leads in a display panel in one-to-one correspondence.

In some embodiments, two second fan-out wires are disposed between every two adjacent first fan-out wires.

In some embodiments, the first fan-out wire is made of metal aluminum.

In some embodiments, the first fan-out wire is made of metal copper.

In some embodiments, the first fan-out wire is formed on the surface of indium tin oxide glass.

In some embodiments, a wire pitch between adjacent first fan-out wires is 10 micrometers to 15 micrometers.

Other embodiments of the present application provides a fan-out wire arrangement, formed between a display panel and a driving component, and configured to transmit a data signal, where the fan-out wire arrangement includes:

a plurality of first fan-out wires, where a dummy insulation wire is disposed at each first fan-out wire; and a plurality of second fan-out wires, where at least one second fan-out wire is disposed between every two adjacent first fan-out wires, and the plurality of first fan-out wires and the plurality of second fan-out wires are distributed side by side, where the dummy insulation wires on every two adjacent first fan-out wires have the same length; and the same number of second fan-out wires are provided between every two adjacent first fan-out wires.

In some embodiments, the first fan-out wire is made of metal copper.

In some embodiments, the first fan-out wire is formed on the surface of indium tin oxide glass.

Some embodiments of the present application further provides a display device, including:

a display panel;

a driving component, electrically connected to the display panel, disposed adjacent to a side of the display panel and spaced from the display panel; and a fan-out wire arrangement, where the fan-out wire arrangement is formed in a peripheral region of the display panel and connected to the driving component, where the fan-out wire arrangement includes:

a plurality of first fan-out wires, where a dummy insulation wire is disposed at each first fan-out wire; and a plurality of second fan-out wires, where at least one second fan-out wire is disposed between every two adjacent first fan-out wires, and the plurality of first fan-out wires and the plurality of second fan-out wires are distributed side by side.

In some embodiments, the dummy insulation wires on every two adjacent first fan-out wires have the same length.

In some embodiments, the dummy insulation wire is insulated from a data line in the display panel.

The embodiments of the present application provide the fan-out wire arrangement and the display device. The fan-out wire arrangement includes a plurality of first fan-out wires and a plurality of second fan-out wires, a dummy insulation wire is disposed at each first fan-out wire, a preset quantity of second fan-out wires are disposed between every two adjacent first fan-out wires, and the plurality of first fan-out wires and the plurality of second fan-out wires are distributed side by side, so that coupling capacitance generated between adjacent fan-out wires is reduced, thereby improving the stability of a display panel, so as to achieve the objectives of reducing coupling capacitance formed between fan-out wires and improving the stability of the display panel.

BRIEF DESCRIPTION OF THE DRAWINGS

In order to more clearly illustrate the technical solution in embodiments of the present application, the following drawings, which are to be used in the description of the embodiments or the existing techniques, will be briefly described. It will be apparent that the drawings described in the following description are merely embodiments of the present application. Other drawings may be obtained by those skilled in the art without paying creative labor.

DETAILED DESCRIPTION OF THE EMBODIMENTS

Figure 1:
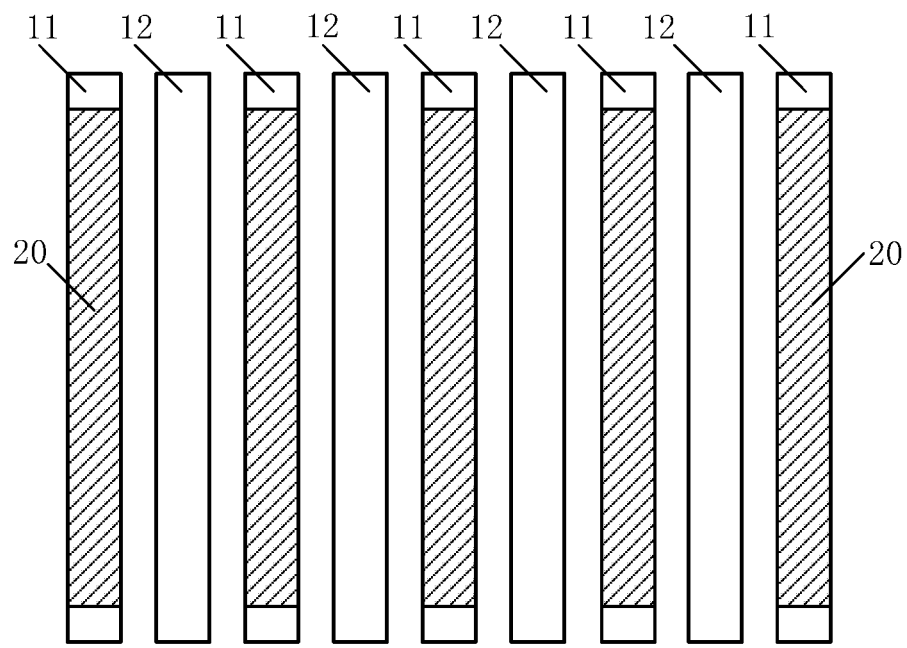
FIG. 1 is a structural schematic view of a fan-out wire arrangement according to some embodiments of the present application.

In order to make the technical problems to be solved, technical solutions, and beneficial effects of the present application more clear, the present application will be further described in detail hereinbelow with reference to the accompanying drawings and embodiments. It should be understood that the specific embodiments described herein are merely intended to explain the application rather than to limit the present application.

It should be noted that when an element is referred to as being "fixed" or "arranged" at/in/on another element, it can be directly at/in/on the other element. When an element is referred to as being "connected" to/with the another element, it can be directly or indirectly connected to/with the other element. It should be understood that terms "top", "bottom", "left", "right", and the like indicating orientation or positional relationship are based on the orientation or the positional relationship shown in the drawings, and are merely for facilitating the description of the present application, rather than indicating or implying that a device or component must have a particular orientation, or be configured or operated in a particular orientation, and thus should not be construed as limiting the application; and the specific meaning of the above terms can be understood by those skilled in the art according to specific circumstances. Moreover, the terms "first" and "second" are adopted for descriptive purposes only and are not to be construed as indicating or implying a relative importance or implicitly indicating the number of technical features indicated. Thus, features defining "first" and "second" may include one or more of the features either explicitly or implicitly. In the description of the present application, the meaning of "a plurality of" or "multiple" is two or more unless otherwise particularly defined. The technical solutions of the present application are described in detail below with reference to the specific accompanying drawings and embodiments.

When fan-out wires are formed in a display device, lateral capacitance between a plurality of first fan-out wires 11 and second fan-out wires 12 is very small and is ignorable. When a residue is formed between the first fan-out wires 11 and the second fan-out wires 12 during etching, in this case, coupling capacitance is generated between adjacent fan-out wires. The coupling capacitance is hundreds of times the lateral capacitance, and may be up to 500 times the lateral capacitance in an application. In this case, the fan-out wires have increased load, and as a result, weak lines relative to other regions are generated.

FIG. 1 is a structural schematic view of a fan-out wire arrangement according to some embodiments of the present application.

As shown in FIG. 1, the fan-out wire arrangement in some embodiments of the present application includes a plurality of first fan-out wires 11 and a plurality of second fan-out wires 12. A dummy insulation wire 20 is disposed at each first fan-out wire 11. At least one second fan-out wire 12 is disposed between every two adjacent first fan-out wires 11. The plurality of first fan-out wires 11 and the plurality of second fan-out wires 12 are distributed side by side.

In some embodiments, no dummy insulation wire 20 is disposed on the second fan-out wires 12. That is, the second fan-out wires 12 are insulated from the dummy insulation wire 20.

In some embodiments, the reason that weak lines are generated is that fan-out wires corresponding to the weak lines have increased load. The increased load is caused by coupling capacitance. In the fan-out wire arrangement provided in some embodiments, at least one second fan-out wire 12 is disposed between adjacent first fan-out wires 11, thereby reducing the coupling capacitance, so that weak lines in the display device become weak or disappear. Specifically, the coupling capacitance is $C=\varepsilon*60*S/D=\varepsilon*60*a*b/D$, where $\varepsilon$ is a relative dielectric constant, $\varepsilon 0$ is a vacuum dielectric constant, S is an area of each dummy insulation wire, a and b are respectively the length and width of each dummy insulation wire, and D is a distance of a flat plate capacitor, that is, a distance between adjacent dummy insulation wires.

In some embodiments, ends of the first fan-out wires 11 and the second fan-out wires 12 are connected to leads on a panel glass one by one. The length of each lead is 800 micrometers to 1000 micrometers, the lead width of the lead is 15 micrometers to 20 micrometers, and a wire pitch between adjacent leads is 10 micrometers to 15 micrometers.

In some embodiments, the other ends of the first fan-out wires 11 and the second fan-out wires 12 are connected to data signal lines in a display panel. During transmission of a data signal, a thin-film driving chip outputs the data signal by using leads on the thin-film driving chip, the data signal is then output to the first fan-out wires 11 and the second fan-out wires 12 by using glass leads on the display panel, the fan-out wires are then connected to the data signal lines.

In some embodiments, the first fan-out wire 11 and the second fan-out wire 12 are made of metal aluminum.

In some embodiments, the first fan-out wire 11 and the second fan-out wire 12 are made of metal copper.

In some embodiments, the first fan-out wire 11 and the second fan-out wire 12 are formed on the surface of indium tin oxide glass. Indium tin oxide is an electrically conductive and transparent metal material, and is adopted for electrodes in a TFT-LCD.

In some embodiments, a wire pitch between adjacent first fan-out wires 11 is 10 micrometers to 15 micrometers.

In some embodiments, a preset quantity of second fan-out wires 12 are disposed between adjacent first fan-out wires 11, an interval between adjacent dummy insulation wires is increased, the coupling capacitance is reduced, and a probability that weak lines are generated in the display device is reduced. The preset quantity is a quantity of second fan-out wires that is set according to a user requirement.

In some embodiments, the plurality of first fan-out wires 11 and the plurality of second fan-out wires 12 are distributed side by side. Specifically, the "distributed side by side" may be parallel arrangement.

In some embodiments, the dummy insulation wires 20 on adjacent first fan-out wires 11 have the same length. In some embodiments, the plurality of first fan-out wires 11 is arranged in parallel, and the dummy insulation wires 20 on adjacent first fan-out wires 11 have the same length and are also arranged in parallel.

In some embodiments, the dummy insulation wire 20 is insulated from a data line in a display panel. In some embodiments, a plurality of dummy insulation wires 20 has a floating layer structure. That is, the plurality of dummy insulation wires 20 is formed on the fan-out wires and is not in connect with other wires on the display panel.

In some embodiments, the plurality of first fan-out wires 11 has an equal length. In some embodiments, a dummy insulation wire is disposed at each first fan-out wire 11, and the plurality of first fan-out wires 11 on the display panel has the same length.

In some embodiments, the plurality of first fan-out wires 11 and the plurality of second fan-out wires 12 are respectively connected to corresponding data lines in a display panel.

In some embodiments, a quantity of the first fan-out wires 11 and the second fan-out wires 12 is the same as a quantity of the data lines in a display panel. The plurality of first fan-out wires 11 is connected to the same number of data lines in one-to-one correspondence, and the plurality of second fan-out wires 12 is connected to the same number of data lines in one-to-one correspondence.

In some embodiments, the same number of second fan-out wires 12 are provided between adjacent first fan-out wires 11. In some embodiments, a preset quantity of second fan-out wires 12 are disposed between every two adjacent first fan-out wires 11. The preset quantity may be set according to a user requirement. For example, as shown in FIG. 1, the preset quantity may be 1, that is, one second fan-out wire 12 is disposed between two adjacent first fan-out wires 11.

Figure 2:
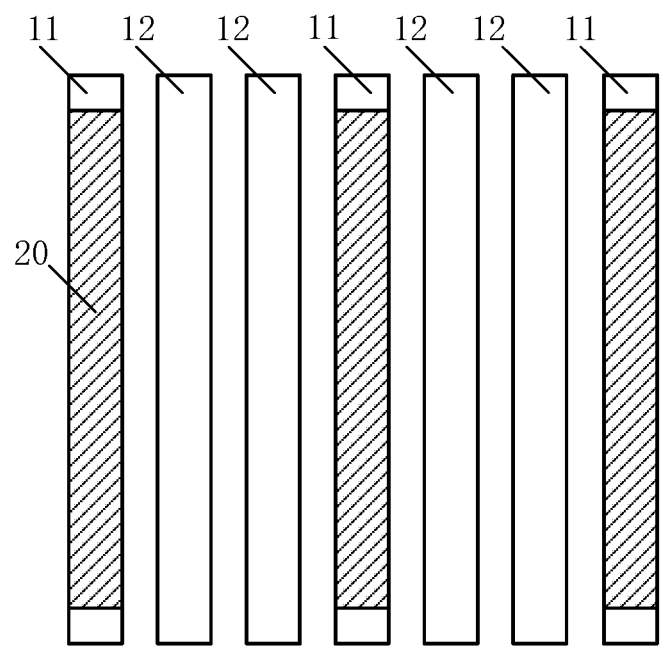
FIG. 2 is a structural schematic view of another fan-out wire arrangement according to some embodiments of the present application.

FIG. 2 is a structural schematic view of another fan-out wire arrangement according to some embodiments of the present application.

As shown in FIG. 2, two second fan-out wires 12 are disposed between adjacent first fan-out wires 11. In some embodiments, no dummy insulation wire 20 is formed on the second fan-out wires 12. In this case, a distance between dummy insulation wires 20 that are arranged in parallel is increased, so as to reduce coupling capacitance between two adjacent dummy insulation wires 20 that are arranged in parallel, thereby mitigating vertical weak lines in a display panel.

Figure 3:
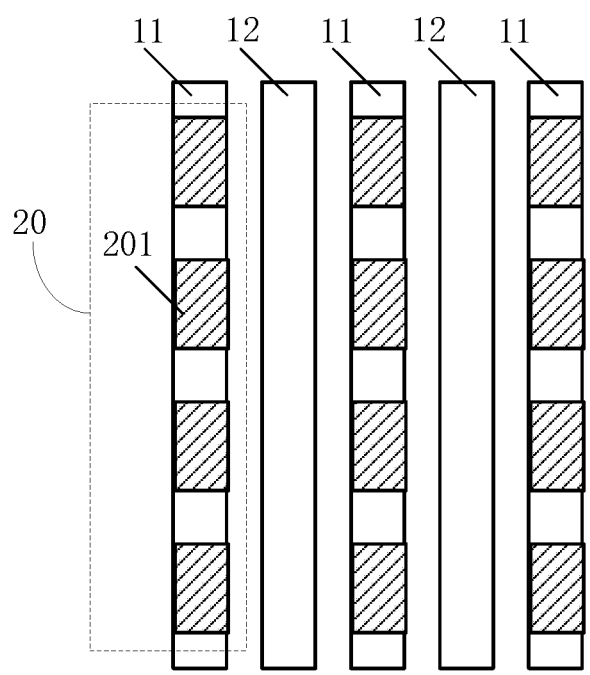
FIG. 3 is a structural schematic view of another fan-out wire arrangement according to some embodiments of the present application.

FIG. 3 is a structural schematic view of another fan-out wire arrangement according to some embodiments of the present application.

As shown in FIG. 3, a dummy insulation wire 20 on each first fan-out wire 11 includes a plurality of sub-dummy insulation wires 201, and the plurality of sub-dummy insulation wires 201 is not in contact with each other.

In some embodiments, the dummy insulation wire 20 is formed on each first fan-out wire 11. The dummy insulation wire 20 includes the plurality of sub-dummy insulation wires 201. Specifically, the plurality of sub-dummy insulation wires on a same first fan-out wire 11 is not in contact with each other.

In some embodiments, the plurality of sub-dummy insulation wires 201 on the same first fan-out wire 11 in some embodiments has a same length, and two adjacent sub-dummy insulation wires 201 on the same first fan-out wire 11 have the same distance.

In some embodiments, a fan-out wire arrangement in some embodiments is formed between a display panel and a driving component, and is configured to transmit a data signal, where the fan-out wire arrangement includes:

a plurality of first fan-out wires, where a dummy insulation wire is disposed at each first fan-out wire; and a plurality of second fan-out wires, where at least one second fan-out wire is disposed between every two adjacent first fan-out wires, and the plurality of first fan-out wires and the plurality of second fan-out wires are distributed side by side, where the dummy insulation wires on every two adjacent first fan-out wires have the same length; and the same number of second fan-out wires are provided between every two adjacent first fan-out wires.

In some embodiments, the first fan-out wire is made of metal copper.

In some embodiments, the first fan-out wire is formed on the surface of indium tin oxide glass.

In some embodiments, the present application provides a display device, including:

a display panel;

a driving component, electrically connected to the display panel, disposed adjacent to a side of the display panel and spaced from the display panel; and a fan-out wire arrangement, where the fan-out wire arrangement is formed in a peripheral region of the display panel and connected to the driving component, where the fan-out wire arrangement includes:

a plurality of first fan-out wires, where a dummy insulation wire is disposed at each first fan-out wire; and a plurality of second fan-out wires, where at least one second fan-out wire is disposed between every two adjacent first fan-out wires, and the plurality of first fan-out wires and the plurality of second fan-out wires are distributed side by side.

In some embodiments, the dummy insulation wires on every two adjacent first fan-out wires 11 have the same length.

In some embodiments, the dummy insulation wire is insulated from a data line in the display panel.

In some embodiments, the plurality of first fan-out wires 11 and the plurality of second fan-out wires 12 are distributed side by side. Specifically, the "distributed side by side" may be parallel arrangement.

In some embodiments, the dummy insulation wires 20 on adjacent first fan-out wires 11 have the same length. In some embodiments, the plurality of first fan-out wires 11 is arranged in parallel, and the dummy insulation wires 20 on adjacent first fan-out wires 11 have the same length and are also arranged in parallel.

In some embodiments, the dummy insulation wire 20 is insulated from a data line in the display panel. In some embodiments, a plurality of dummy insulation wires 20 has a floating layer structure. That is, the plurality of dummy insulation wires 20 is formed on a fan-out wire, and is not connected to other wires on the display panel.

In some embodiments, the plurality of first fan-out wires 11 has an equal length. In some embodiments, the dummy insulation wire is disposed at each first fan-out wire 11, and the plurality of first fan-out wires 11 on the display panel has the same length.

In some embodiments, the plurality of first fan-out wires 11 and the plurality of second fan-out wires 12 are respectively connected to corresponding data lines in the display panel.

In some embodiments, a quantity of the first fan-out wires 11 and the second fan-out wires 12 is the same as a quantity of the data lines in the display panel. The plurality of first fan-out wires 11 is connected to the same number of data lines in one-to-one correspondence, and the plurality of second fan-out wires 12 is connected to the same number of data lines in one-to-one correspondence.

In some embodiments, the same number of second fan-out wires 12 are provided between adjacent first fan-out wires 11. In some embodiments, a preset quantity of second fan-out wires 12 are disposed between every two adjacent first fan-out wires 11. The preset quantity may be set according to a user requirement. For example, as shown in FIG. 1, the preset quantity may be 1. That is, one second fan-out wire 12 is disposed between two adjacent first fan-out wires 11.

In some embodiments, the display panel may be any type of display panel, for example, a liquid crystal display (LCD) panel based on an LCD apparatus technology, an organic electroluminescence display (OLED) panel based on an OLED technology, a quantum-dot light-emitting diode (QLED) display panel based on a QLED technology or a curved display panel.

In some embodiments, the driving component is electrically connected to the display panel, disposed adjacent to a side of the display panel and spaced from the display panel.

In some embodiments, the driving component may include a source driving chip or a gate driving chip, a first driving component disposed on an upper side of the display panel, and a second driving component disposed on a left side of the display panel. The display panel is arranged at an interval from the first driving component and the second driving component. A part, located at the interval, of the fan-out wire arrangement is a straight line section.

In some embodiments, the display panel includes a filter substrate, a pixel array, and an array substrate that are stacked sequentially. The filter substrate covers the pixel array and is arranged at an interval from the first driving component and the second driving component. A part, located at the interval, of the fan-out wire arrangement is a straight line section.

In some embodiments, the filter substrate may be any substrate that can implement a light filtering effect, for example, a color filter substrate formed of a color filter.

In some embodiments, the pixel array may include a plurality of subpixels that is regularly arranged into any shape, for example, may include a plurality of rows of subpixels that are regularly arranged into a rectangle. Each row of subpixels in the pixel array includes a plurality of groups of subpixels. Each of group subpixels includes a first color subpixel, a second color subpixel, and a third color subpixel that are arranged sequentially. Subpixels that are located in a same column have the same color. At least one of the first color subpixel, the second color subpixel, and the third color subpixel is a red subpixel, at least one of the first color subpixel, the second color subpixel, and the third color subpixel is a green subpixel, and at least one of the first color subpixel, the second color subpixel, and the third color subpixel is a blue subpixel. In some embodiments, the display device further includes a driving substrate. The driving substrate is disposed below the display panel, the first driving component, and the second driving component and is electrically connected to the display panel, the first driving component, and the second driving component.

The embodiments of the present application provide the fan-out wire arrangement and the display device. The fan-out wire arrangement includes a plurality of first fan-out wires and a plurality of second fan-out wires, a dummy insulation wire is disposed at each first fan-out wire, a preset quantity of second fan-out wires are disposed between every two adjacent first fan-out wires, and the plurality of first fan-out wires and the plurality of second fan-out wires are distributed side by side, so that coupling capacitance generated between adjacent fan-out wires is reduced, thereby improving the stability of a display panel, so as to achieve the objectives of reducing coupling capacitance formed between fan-out wires and improving the stability of the display panel.

In some embodiments, the driving substrate is a thin-film transistor (TFT) substrate.

The above descriptions are merely optional embodiments of the present application, and are not intended to limit the present application. Any modification, equivalent replacement, or improvement made without departing from the spirit and principle of the present application shall fall within the protection scope of the present application.

What is claimed is:

1. A fan-out wire arrangement, comprising:
   a plurality of first fan-out wires, wherein a dummy insulation wire is disposed at each first fan-out wire, a length of the dummy insulation wire is shorter than a length of each corresponding first fan-out wire supporting the dummy insulation; and
   a plurality of second fan-out wires, wherein at least one second fan-out wire is disposed between every two adjacent first fan-out wires, and the plurality of first fan-out wires and the plurality of second fan-out wires are distributed side by side and parallel from each other, wherein the dummy insulation wire on each first fan-out wire comprises a plurality of sub-dummy insulation wires, and the plurality of sub-dummy insulation wires is not in contact with each other.

2. The fan-out wire arrangement according to claim 1, wherein dummy insulation wires on every two adjacent first fan-out wires have a same length.

3. The fan-out wire arrangement according to claim 1, wherein the dummy insulation wire is insulated from a data line in a display panel, the dummy insulation wire has a floating layer structure, the dummy insulation wire is formed on a fan-out wire, and is not connected to other wires on the display panel.

4. The fan-out wire arrangement according to claim 1, wherein the plurality of first fan-out wires has an equal length.

5. The fan-out wire arrangement according to claim 1, wherein the plurality of first fan-out wires and the plurality of second fan-out wires are respectively connected to corresponding data lines in a display panel.

6. The fan-out wire arrangement according to claim 1, wherein q same number of second fan-out wires are provided between every two adjacent first fan-out wires.

7. The fan-out wire arrangement according to claim 6, wherein one second fan-out wire is disposed between every two adjacent first fan-out wires.

8. The fan-out wire arrangement according to claim 6, wherein two second fan-out wires are disposed between every two adjacent first fan-out wires.

9. The fan-out wire arrangement according to claim 1, wherein the plurality of first fan-out wires and the plurality of second fan-out wires are respectively connected to corresponding leads in a display panel in one-to-one correspondence.

10. The fan-out wire arrangement according to claim 1, wherein the first fan-out wire is made of metal aluminum.

11. The fan-out wire arrangement according to claim 1, wherein the first fan-out wire is made of metal copper.

12. The fan-out wire arrangement according to claim 1, wherein the first fan-out wire is formed on a surface of indium tin oxide glass.

13. The fan-out wire arrangement according to claim 1, wherein a wire pitch between adjacent first fan-out wires is 10 micrometers to 15 micrometers.

14. The fan-out wire arrangement according to claim 1, wherein the dummy insulation wire is parallel with the second fan-out wires.

15. A fan-out wire arrangement, formed between a display panel and a driving component, and configured to transmit a data signal, wherein the fan-out wire arrangement comprises:
  a plurality of first fan-out wires, wherein a dummy insulation wire is disposed at each first fan-out wire, a length of the dummy insulation wire is shorter than a length of each corresponding first fan-out wire supporting the dummy insulation; and
  a plurality of second fan-out wires, wherein at least one second fan-out wire is disposed between every two adjacent first fan-out wires, and the plurality of first fan-out wires and the plurality of second fan-out wires are distributed side by side and parallel from each other, wherein
  dummy insulation wires on every two adjacent first fan-out wires have a same length; and
  a same number of second fan-out wires are provided between every two adjacent first fan-out wires, wherein the dummy insulation wire on each first fan-out wire comprises a plurality of sub-dummy insulation wires, and the plurality of sub-dummy insulation wires is not in contact with each other, and the dummy insulation wire is parallel with the second fan-out wires.

16. The fan-out wire arrangement according to claim 15, wherein the first fan-out wire is made of metal copper.

17. The fan-out wire arrangement according to claim 15, wherein the first fan-out wire is formed on the surface of indium tin oxide glass, the dummy insulation wire has a floating layer structure, the dummy insulation wire is formed on a fan-out wire, and is not connected to other wires on the display panel.

18. A display device, comprising:
  a display panel;
  a driving component, electrically connected to the display panel, disposed adjacent to a side of the display panel and spaced from the display panel; and
  a fan-out wire arrangement, wherein the fan-out wire arrangement is formed in a peripheral region of the display panel and connected to the driving component, wherein
  the fan-out wire arrangement comprises:
  a plurality of first fan-out wires, wherein a dummy insulation wire is disposed at each first fan-out wire, a length of the dummy insulation wire is shorter than a length of each corresponding first fan-out wire supporting the dummy insulation; and
  a plurality of second fan-out wires, wherein at least one second fan-out wire is disposed between every two adjacent first fan-out wires, and the plurality of first fan-out wires and the plurality of second fan-out wires are distributed side by side and parallel from each other, wherein the dummy insulation wire on each first fan-out wire comprises a plurality of sub-dummy insulation wires, and the plurality of sub-dummy insulation wires is not in contact with each other, and the dummy insulation wire is parallel with the second fan-out wires.

19. The display device according to claim 18, wherein dummy insulation wires on every two adjacent first fan-out wires have a same length.

20. The display device according to claim 18, wherein the dummy insulation wire is insulated from a data line in the display panel, the dummy insulation wire has a floating layer structure, the dummy insulation wire is formed on a fan-out wire, and is not connected to other wires on the display panel.

* * * * *